United States Patent
Garbarino et al.

(10) Patent No.: US 9,954,501 B2
(45) Date of Patent: Apr. 24, 2018

(54) DIFFERENTIAL AMPLIFIER WITH COMMON MODE COMPENSATION CIRCUIT

(71) Applicant: STMICROELECTRONICS S.R.L., Agrate Brianza (IT)

(72) Inventors: Marco Garbarino, Bareggio (IT); Roberto Modaffari, Pallanzeno (IT); Germano Nicollini, Piacenza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 157 days.

(21) Appl. No.: 15/156,155

(22) Filed: May 16, 2016

(65) Prior Publication Data

US 2017/0170795 A1 Jun. 15, 2017

(30) Foreign Application Priority Data

Dec. 15, 2015 (IT) .......................... 102015000083626

(51) Int. Cl.
*H03F 3/45* (2006.01)

(52) U.S. Cl.
CPC ... *H03F 3/45179* (2013.01); *H03F 2200/129* (2013.01); *H03F 2203/45601* (2013.01)

(58) Field of Classification Search
CPC ........................................................ H03F 3/45
USPC .................................................. 330/69, 258
See application file for complete search history.

(56) References Cited

U.S. PATENT DOCUMENTS

| | | | | | |
|---|---|---|---|---|---|
| 4,667,165 | A | * | 5/1987 | De Weck | H03F 3/305 330/253 |
| 5,212,455 | A | * | 5/1993 | Pernici | H03F 1/086 330/253 |
| 7,310,017 | B2 | * | 12/2007 | Etou | H03F 3/3022 330/253 |
| 7,453,319 | B2 | * | 11/2008 | Gupta | H03F 3/45192 330/253 |
| 7,816,988 | B2 | * | 10/2010 | Wu | H03F 1/26 330/149 |

FOREIGN PATENT DOCUMENTS

EP 2 916 456 A1 9/2015

OTHER PUBLICATIONS

Babanezhad, J. N., "A Low-Output-Impedance Fully Differential Op Amp with Large Output Swing and Continuous-Time Common-Mode Feedback," IEEE Journal of Solid-state Circuits, IEEE Service Center, Piscataway, NJ, vol. 26, No. 12, Dec. 1, 1991 (9 pgs.).

(Continued)

*Primary Examiner* — Henry Choe
(74) *Attorney, Agent, or Firm* — Seed Intellectual Property Law Group LLP (57) ABSTRACT

An amplifier includes a first input branch and a second input branch that form a differential input stage and a current mirror connected to the differential input. The current mirror is governed as a function of a common mode feedback signal applied to a control node of the current mirror. A second, amplification, stage includes a branch flowing through which is a current, which is a function of the current that flows in the first input branch, and is in turn connected to a first output branch. A capacitive element is coupled between the control node and the second stage. The circuit is symmetrical with respect to the input stage.

18 Claims, 5 Drawing Sheets

(56) References Cited

OTHER PUBLICATIONS

Deligoz, I., et al., "A MEMS-Based Power-Scalable Hearing Aid Analog Front End," IEEE Transactions on Biomedical Circuits and Systems, IEEE, US, vol. 5, No. 3, May 25, 2011 (13 pgs.).

* cited by examiner

FIG. 1

*(Prior Art)*

FIG. 2

*(Prior Art)*

DIFFERENTIAL AMPLIFIER WITH COMMON MODE COMPENSATION CIRCUIT

BACKGROUND

Technical Field

The present disclosure relates to a differential amplifier with common mode compensation circuit.

Description of the Related Art

General-purpose operational amplifiers are compensated in frequency in order to be stable in unit-gain configuration, i.e., in the worst-case condition of closed-loop gain.

Instead, an amplifier that forms part of an integrated circuit is typically designed to have a closed-loop gain correlated to a specific need, with a gain predefined as a function of the application chosen. In the case of small input signals, the amplifier typically presents a high closed-loop gain, for example, between 10 and 100. Known amplifiers with gain higher than one may have an inverting configuration or a non-inverting configuration, with appropriate choice of the value of resistance on the feedback branch.

Figure 1:
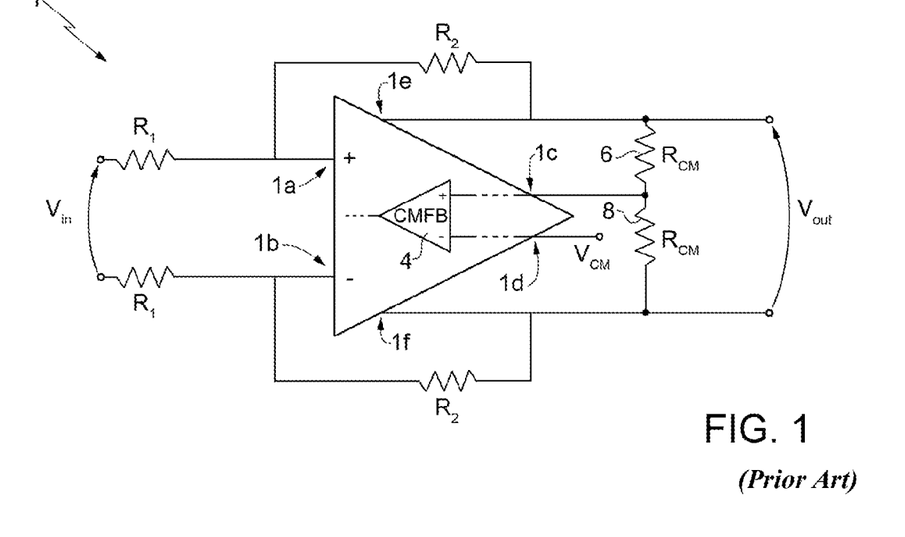
FIG. 1 is a schematic illustration of an amplifier according to an embodiment of a known type.

In order to handle the limited supply voltages available in portable devices, and to reject common mode or supply noise or interference, typically fully differential or fully balanced amplifiers are used. A fully differential amplifier, with high gain, of an inverting type, is illustrated in FIG. 1. An amplifier 1 of this type includes four input terminals 1a-1d and two output terminals 1e, 1f. The terminal 1a is a non-inverting terminal, and the terminal 1b is an inverting terminal. An input signal (voltage) Vin, is applied between the input terminals 1a and 1b, by interposition of resistors, which have the same value of resistance R1. The output terminals 1c and 1d are coupled in feedback mode to the input terminals 1a and 1b, respectively, by respective resistors, which have values of resistance R2 that are the same as one another. The difference between the output terminals Vout represents the useful differential signal, i.e., the input signal Vin amplified by the ratio R2/R1.

A common mode feedback circuit is implemented, in a per se known manner, by integration of a common mode amplifier 4, configured to fix the value of the half-sum of the outputs 1e and 1f, which is defined as "common mode", at a pre-set value $V_{CM}$. The input 1c of the amplifier 1 is coupled between an input of the common mode amplifier 4 and the output terminals 1c, 1d by the resistors 6, 8. The input 1d of the amplifier 1 is biased at a fixed voltage $V_{CM}$, chosen as desired for fixing the common mode of the differential output signal of the amplifier ($V_{CM}$ is chosen, for example, in a range comprised between a supply voltage $V_{CC}$ and a voltage of a reference node, e.g., ground reference equal to 0 V—for example, $V_{CM}$ is equal to $V_{CC}/2$).

Figure 2:
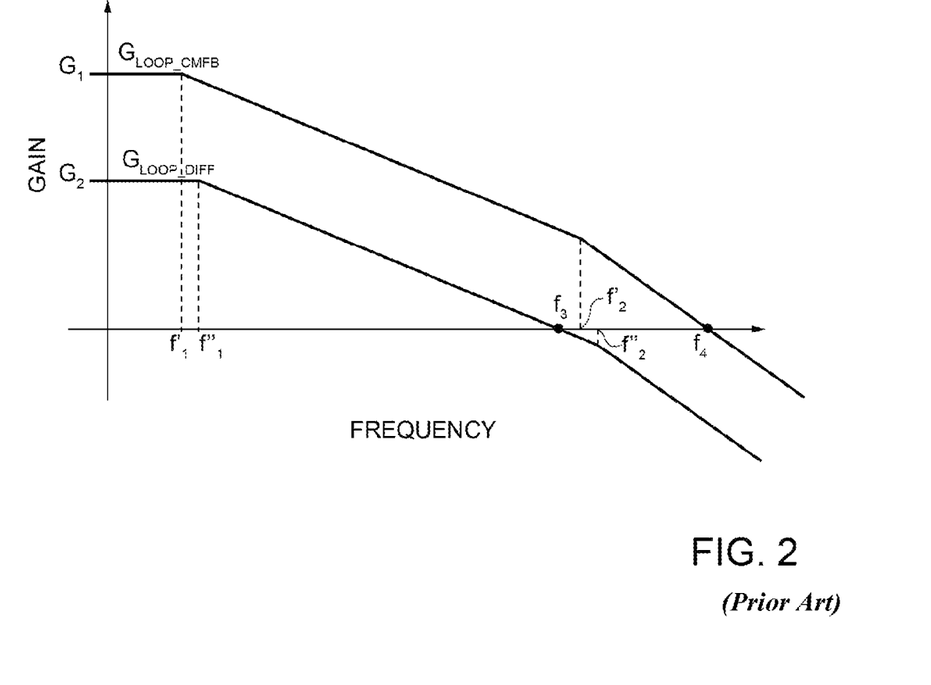
FIG. 2 shows a Bode diagram of the loop gain of respective common mode and differential amplification circuits belonging to the amplifier of FIG. 1.

Frequency compensation of the differential path is carried out at a frequency that is β times lower than the unit-gain frequency of the amplifier, where β is the feedback factor given by R1/(R1+R2). This technical solution has the function of preventing the design of the amplifier from being over-sized in terms of electric-power consumption and area of silicon. However, the common mode feedback path is compensated in frequency at the unit-gain frequency, given that its feedback factor is 1. With reference to FIG. 2, the curve $G_{LOOP\_CMFB}$ represents the loop gain for the common mode amplifier 4 ($G_{LOOP\_CMFB} = A_{CMBF}$), whereas the curve $G_{LOOP\_DIFF}$ represents the loop gain for the differential amplifier 1 ($G_{LOOP\_DIFF} = \beta A_{DIFF}$). As may be noted from the Bode diagram of FIG. 2, the gain of the common mode amplifier 4 and of the differential amplifier 1 follow a similar pattern, with respective poles at frequency values $f_1' \sim f_1''$, and $f_2' \sim f_2''$, but different gain values $G_1 > G_2$ on the input. It follows that, whereas the curve of $G_{LOOP\_DIFF}$ intercepts the frequency axis at $f_3 < f_2''$ with a slope of 20 dB/dec, the curve of $G_{LOOP\_CMFB}$ intercepts the frequency axis at $f_4 > f_2'$ (i.e., after the second pole) and with a slope of 40 dB/dec. This causes an instability of the common mode amplifier 4.

BRIEF SUMMARY

In one or more embodiments, the present disclosure provides a differential amplifier with a common mode compensation circuit that will be able to overcome the critical aspects of the prior art.

In one embodiment, the present disclosure provides a multistage differential amplifier that includes first and second differential input terminals configured to receive a differential input voltage, first and second differential output terminals, a common mode detection circuit, an input stage, a gain stage, an output stage and first and second capacitive elements.

The common mode detection circuit is coupled to the first and second differential output terminals and configured to detect a common mode voltage and to generate a common mode feedback voltage for compensating the detected common mode voltage.

The input stage includes: a first differential input transistor coupled between a supply terminal and a first output node, and having a control terminal coupled to the first differential input terminal, the first differential input transistor being configured to supply a first differential driving signal to the first output node, a second differential input transistor coupled between the supply terminal and a second output node, and having a control terminal coupled to the second differential input terminal, the second differential input transistor being configured to supply a second differential driving signal to the second output node, a first active load coupled between the first output node and the reference terminal, and a second active load coupled between the second output node and the reference terminal, said first and second active loads having respective control terminals coupled to a common control node configured to receive the common mode feedback voltage.

The gain stage includes first and second gain inputs respectively coupled to the first and second output nodes, and first and second gain output terminals configured to supply first and second amplified differential signals, respectively.

The output stage includes: a first output branch including a first PMOS transistor having a control terminal operatively coupled to the first gain output terminal, and a first NMOS transistor having a control terminal operatively coupled to the first output node, the first PMOS transistor and first NMOS transistor having respective electrical conduction terminals coupled to one another and to the first differential output terminal, and a second output branch including a second PMOS transistor having a control terminal operatively coupled to the second gain output terminal, and a second NMOS transistor having a control terminal operatively coupled to the second output node, the second PMOS transistor and second NMOS transistor having respective electrical conduction terminals coupled to one another and to the second differential output terminal.

The first capacitive element is coupled between the control node and the first gain output terminal, and the second capacitive element is coupled between the control node and the second gain output terminal.

In another embodiment, the present disclosure provides a multistage differential amplifier that includes an input stage, first and second differential output terminals, a common mode detection circuit, a gain stage and first and second capacitive elements. The input stage includes first and second differential input transistors having respective control terminals configured to receive a differential input voltage, and first and second load transistors having respective control terminals coupled to one another at a control node and configured to receive a common mode feedback voltage.

The common mode detection circuit is coupled to the first and second differential output terminals and configured to generate the common mode feedback voltage.

The gain stage is coupled to the input stage and including first and second gain output nodes configured to supply first and second amplified differential signals, respectively.

The first capacitive element is coupled between the control node and the first gain output node, and the second capacitive element is coupled between the control node and the second gain output node.

In still another embodiment, the present disclosure provides a method of forming a multistage differential amplifier that includes: forming an input stage including first and second differential input transistors and first and second load transistors; coupling a control terminal of the first differential input transistor to a first differential input terminal; coupling a control terminal of the second differential input transistor to a second differential input terminal; coupling a control terminal of the first load transistor to a control terminal of the second load transistor at a control node; forming first and second differential output terminals; forming a common mode detection circuit; coupling the common mode detection circuit to the first and second differential output terminals; forming a gain stage including first and second gain output nodes configured to supply first and second amplified differential signals, respectively; coupling the gain stage to the input stage; coupling a first capacitive element between the control node and the first gain output node; and coupling a second capacitive element between the control node and the second gain output node.

BRIEF DESCRIPTION OF THE SEVERAL VIEWS OF THE DRAWINGS

For a better understanding of the present disclosure, a preferred embodiment is described herein, purely by way of non-limiting example, with reference to the attached drawings, wherein.

DETAILED DESCRIPTION

Figure 3:
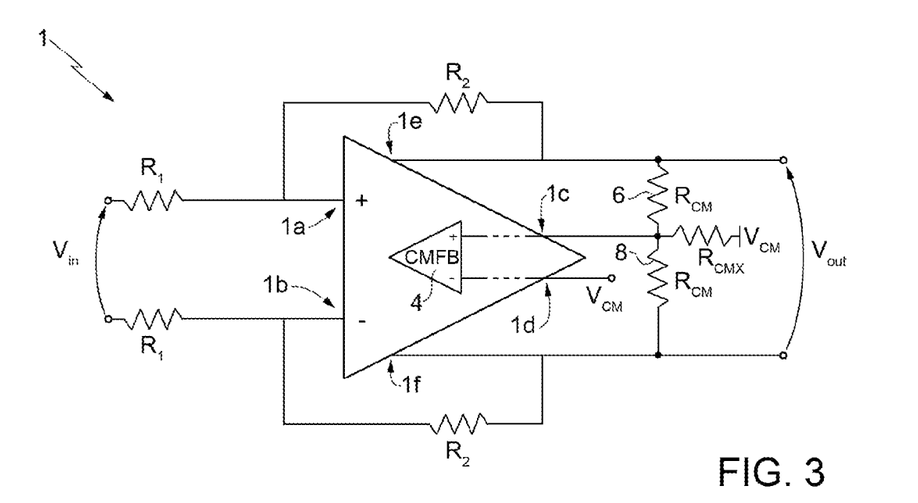
FIG. 3 is a schematic illustration of an amplifier according to an embodiment that does not form the subject of the present disclosure.

FIG. 3 shows a differential amplifier that does not form the subject of the present disclosure. The amplifier of FIG. 3 enables reduction of the common mode feedback factor $\beta_{CMFB}$ down to a value close to, or even lower than, the feedback factor $\beta$ of the differential path. This is rendered possible by adding a further resistor 7 with respect to the embodiment of FIG. 1, said resistor 7 having a resistance $R_{CMX} \ll R_{CM}$ and such as to define a $\beta_{CMFB} \ll 1$. In fact, the common mode feedback factor $\beta_{CMFB}$ is in this case defined by:

$$\beta_{CMFB} = \frac{R_{CMX}}{R_{CMX} + (R_{CM}/2)}$$

Figure 4:
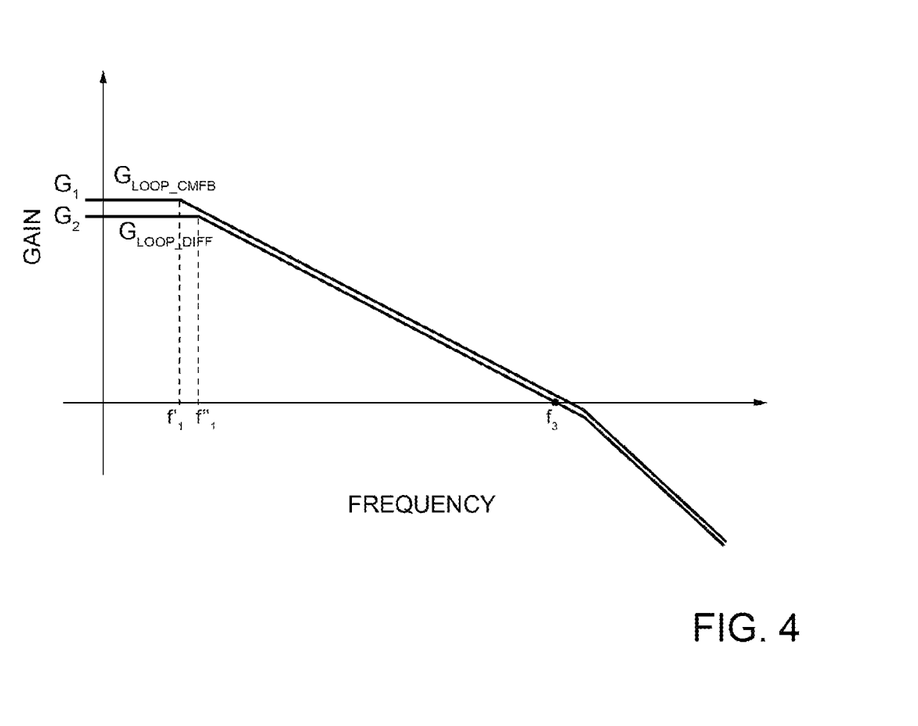
FIG. 4 shows a Bode diagram of the loop gain of respective common mode and differential amplification circuits belonging to the amplifier of FIG. 3.

FIG. 4 shows, by the curve $G_{LOOP\_CMFB}$, the loop gain for the common mode amplifier 4 in the case illustrated in FIG. 3, and, by the curve $G_{LOOP\_DIFF}$, the differential loop gain. As may be noted from the Bode diagram of FIG. 4, the gain of the common mode amplifier 4 and of the differential amplifier 1 almost coincide, with respective poles at frequency values $f_1' \sim f_1''$, and $f_2' \sim f_2''$, and respective gain values $G_1 \sim G_2$ on the input. It follows that both the curve of $G_{LOOP\_DIFF}$ and the curve $G_{LOOP\_CMFB}$ intercept the frequency axis with a slope of 20 dB/dec. The instability of the common mode amplifier 4 is thus resolved.

Figure 5:
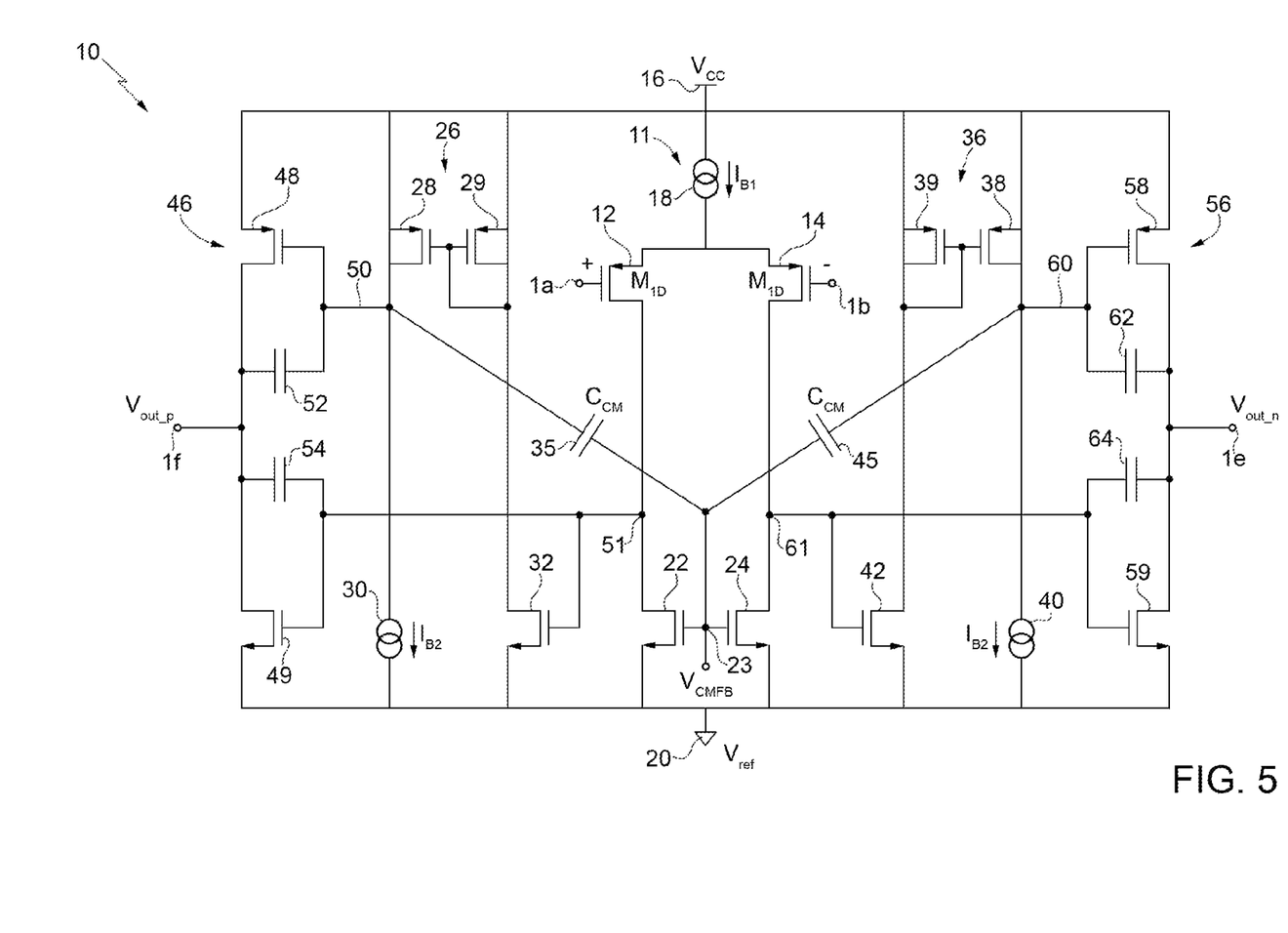
FIGS. 5 and 6 show a differential amplifier with common mode compensation circuit according to the present disclosure.
Figure 6:
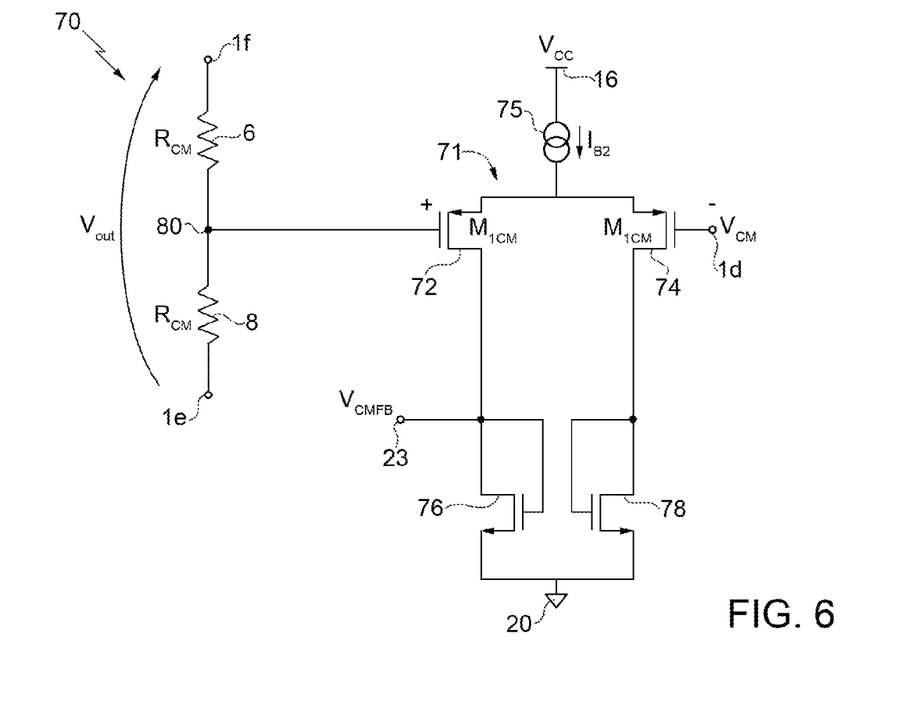

A different solution, which does not form part of the present disclosure, envisages reduction of the transconductance of just the common mode input stage (which, as has been said, is not in common with the differential input stage) in order to reduce the common mode gain and thus obtain a plot of the gain, as a function of frequency, similar to the one illustrated in FIG. 4. This may be obtained:

(i) by choosing a value of the current $I_{B2}$ that flows in the common mode input stage (see, for example, FIG. 6) much lower than the current $I_{B1}$ that flows in the differential input stage (see, for example, FIG. 5); and (ii) by varying the geometrical dimensions of the input transistors of the differential and common mode input stages, in particular by reducing the width W of the conductive channel of said transistors (and consequently reducing the transconductance $g_m$); in particular, with reference by way of example to FIGS. 5 and 6, the relation $W_{M1CM} \ll W_{M1D}$ should apply, where $W_{M1D}$ is the value of width of the conductive channel of the transistors identified by the references 12 and 14 (inputs of the differential amplifier), and $W_{M1CM}$ is the value of width of the conductive channel of the transistors identified by the references 72 and 74 (inputs of the common mode amplifier).

However, both of the aforementioned embodiments present similar problems. The mismatch $\Delta I$ between the biasing current in the differential input stage—for example, the current through the transistors 22, 24 of FIG. 5 is not exactly equal to $I_{B1}/2$—results in a common mode output voltage error $$\Delta V_{O\_CM} = \frac{\Delta I}{\beta_{CMFB} \cdot g_{m\_CMFB}}$$

As a consequence of this, the lower the values of $\beta_{CMFB}$ and $g_{m\_CMFB}$ the higher the common mode output voltage error. The error may easily reach some hundreds of millivolts in the worst case, which is not acceptable in low-power and low-voltage circuits. In fact, since in low-voltage circuits the output swing available may be less than 1 V, it is not tolerable to reduce the output dynamics by some hundreds of millivolts on account of the common mode error. Furthermore, the common mode output error generates an undesired current $I_{waste}$ on the load, defined by the following formula:

$$I_{waste} = \frac{2\Delta V_{O\_CM}}{R_{load}}$$

where, if for example the load resistance $R_{load}$ is 100 kΩ and $\Delta V_{o\_CM}$ is 200 mV, the undesired current $I_{waste}$ assumes a value of 4 µA, which should be avoided in the design of low-power circuits.

Figure 7:
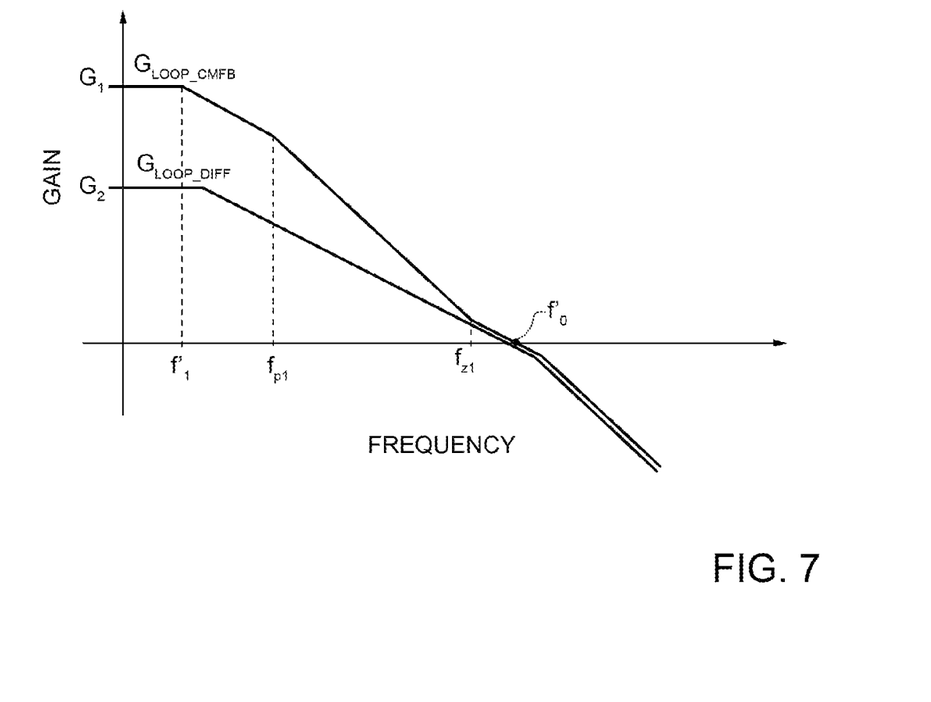
FIG. 7 shows a Bode diagram of the loop gain of respective common mode and differential amplification circuits belonging to the amplifier of FIGS. 5 and 6.

The solution according to the present disclosure, illustrated with reference to FIGS. 5-7, enables introduction of a pole and a zero in the Bode diagram of the common mode loop gain $G_{LOOP\_CMFB}$ in order to compensate in frequency the common mode feedback amplifier with minimal impact on the differential amplifier. Implementation, as illustrated in detail in what follows, envisages introduction (in a multistage amplifier circuit of a per se known type) of two capacitive elements (designated by 35 and 45 in FIG. 5) for implementing a simple circuit solution and that does not require an extra current consumption. In this way, further, there is no need to reduce the common mode feedback factor $\beta_{CMFB}$ and/or the transconductance $g_{m\_CMFB}$ of the common mode input stage, thus avoiding all the disadvantages set forth previously.

FIG. 5 is a schematic representation of a differential amplifier 10 of a multistage type, in particular with three stages, according to one aspect of the present disclosure. Elements of the amplifier 10 of FIG. 5 common to the amplifier 1 of FIG. 1 are designated by the same reference numbers and are not described any further.

The differential amplifier 10 comprises a differential input stage 11, including an input transistor 12, having its gate terminal coupled to the non-inverting input 1a, and an input transistor 14, having its own gate terminal coupled to the inverting input 1b. In particular, the input transistors 12 and 14 are MOSFETs of a P type. The differential input stage 11 receives a main supply $V_{CC}$ from the electric power-supply terminal 16. A current generator 18 is coupled to the electric power-supply terminal 16 and generates a flow of current $I_{B1}$ that flows through the two branches that form the differential input stage 11. The main supply $V_{CC}$ has, by way of example, a value comprised between 1 V and 5 V.

A respective drain terminal of the input transistors 12, 14 is coupled to a reference terminal 20 at potential $V_{REF}$ (e.g., ground reference at 0 V), via an active load formed, respectively, by the transistors 22, 24 (which, in particular, are both MOSFETs of an N type). The drain terminal of the transistors 12 and 22 corresponds to a first output terminal of the differential input stage (node 51). Likewise, the drain terminal of the transistors 14 and 24 corresponds to a second output terminal of the differential input stage (node 61).

The transistors 22, 24 have their respective gate terminals coupled to a common mode feedback node 23, biased at a voltage $V_{CMFB}$ generated by the circuit of FIG. 6 and described with reference to said figure. The transistors 22 and 24, which may be represented schematically as generic current generators, have the function of setting an operating point for balancing of the currents of the differential input stage 11.

The differential amplifier 10 further comprises a second stage 26, including two transistors 28, 29 (in particular, MOSFETs of a P type), which have their own source terminals electrically coupled to the supply terminal 16, and their respective gate terminals connected to one another in current-mirror configuration. Furthermore, the gate terminals are biased with the voltage present on the drain terminal of the transistor 29 (the latter is thus diode-connected).

Once again with reference to the second stage 26, the transistor 28 is coupled to the reference terminal 20 by a current generator 30, which identifies a current $I_{B2}$ that flows in the branch to which the transistor 28 belongs. The transistor 29 is coupled to the reference terminal 20 by a further transistor 32 having its gate terminal biased by the voltage present on the first output terminal 51 of the differential input stage 11.

According to an aspect of the present disclosure, a first capacitive element 35 (in particular, a capacitor) is electrically coupled between the common mode feedback node 23 (coinciding with the gate terminals of the transistors 22, 24, and biased at the voltage $V_{CMFB}$) and the drain terminal of the transistor 28 of the second stage 26.

A third stage 36 is similar to the second stage 26 and specular with respect to the differential input stage 11. In detail, the third stage 36 includes two transistors 38, 39 (in particular, MOSFETs of a P type), which have their own source terminals electrically coupled to the supply terminal 16, and their respective gate terminals connected to one another, in current-mirror configuration. Furthermore, the gate terminals are biased with the voltage present on the drain terminal of the transistor 39 (the latter, thus, is diode-connected).

Once again with reference to the third stage 36, the transistor 38 is coupled to the reference terminal 20 by a current generator 40, which identifies a current $I_{B2}$ that flows in the branch of the transistor 38 (in particular, it may be noted that, but for variations that are not particularly significant and are due to non-idealities of the components of the circuit, the current that flows through the transistor 38 of the third stage 36 has the same value as the current that flows through the transistor 28 of the second stage 26). The transistor 39 is coupled to the reference terminal 20 by a further transistor 42 (in particular, a MOSFET of an N type) having its gate terminal biased by the voltage present on the second output terminal 61 of the differential input stage 11.

According to a further aspect of the present disclosure, a second capacitive element 45 (in particular, a capacitor) is electrically coupled between the common mode feedback node 23 (biased at the voltage $V_{CMFB}$) and the drain terminal of the transistor 38 of the third stage 36.

The first and second capacitive elements 35, 45 have the same capacitance $C_{CM}$, having a value comprised between a few picofarads (e.g., 3 pF) and a few tens of picofarads (e.g., 20 pF), for example 5 pF.

On account of the circuit symmetry of the differential amplifier described previously, the common mode feedback node 23 is not affected by the differential voltage; i.e., it behaves as a ground node for the differential mode.

With reference to the outputs of the differential amplifier 10, a first output stage 46 is connected between the supply terminal 16 and the reference terminal 20 and includes a first output transistor 48 (in particular, a MOSFET of a P type), coupled between the supply terminal 16 and the output terminal 1f, and a second output transistor 49 (in particular, a MOSFET of an N type), coupled between the reference terminal 20 and the output terminal 1f. In greater detail, both of the output transistors 48, 49 have their respective drain terminals connected to the output terminal 1f. The first output stage 46 further has a bias connection 50, for biasing the gate terminal of the output transistor 48 by the signal present on the drain terminal of the transistor 28 of the second stage.

In addition, it may be noted that the gate terminal of the output transistor 48 is electrically coupled to the common mode feedback node 23 through the first capacitive element 35. The first output stage 46 has a further bias connection to the first output terminal 51 of the differential input stage, for biasing the gate terminal of the output transistor 49 by the same voltage signal that biases the gate terminal of the transistor 32.

A first output capacitor 52 is coupled between the output terminal 1f and the bias connection 50 (i.e., between the output terminal 1f and the drain terminal of the transistor 28 of the second stage 26). A second output capacitor 54 is coupled between the output terminal 1f and the bias connection 51 (i.e., between the output terminal 1f and the drain terminal of the input transistor 12 of the first input stage). The first and second output capacitors 52, 54 have the function of compensation, for bestowing higher stability on the differential amplifier 10, as is known according to the prior art (Miller effect). The values of capacitance of the capacitors 52, 54 are chosen as desired in the design stage, for example between a few picofarads and some tens of picofarads.

Furthermore, a second output stage 56 of the differential amplifier 10 is connected between the supply terminal 16 and the reference terminal 20 and includes a third output transistor 58 (in particular, a MOSFET of a P type), coupled between the supply terminal 16 and the output terminal 1e, and a fourth output transistor 59 (in particular, a MOSFET of an N type), with its source coupled to the reference terminal 20 and its drain to the output terminal 1e. In higher detail, both of the output transistors 58, 59 have their respective drain terminals connected to one another and, thus, to the output terminal 1e. The second output stage 56 further has a bias connection 60, for biasing the gate terminal of the output transistor 58 by the signal present on the drain terminal of the transistor 38 of the third stage 36.

Furthermore, it may be noted that the gate terminal of the output transistor 58 is electrically coupled to the common mode feedback node 23 through the second capacitive element 45. The second output stage 56 further has another bias connection to the second output terminal 61 of the differential input stage 11, for biasing the gate terminal of the output transistor 59 by the same voltage signal as the one that biases the gate terminal of the transistor 42.

A third output capacitor 62 is coupled between the output terminal 1e and the bias connection 60 (i.e., between the output terminal 1e and the drain terminal of the transistor 38 of the third stage 36). A fourth output capacitor 64 is coupled between the output terminal 1e and the bias connection 61 (i.e., between the output terminal 1e and the drain terminal of the input transistor 14 of the first input stage). The third and fourth output capacitors 62, 64 have a function similar to that of the first and second capacitors 52, 54, i.e., of compensating the output of the differential amplifier 10 and of bestowing greater stability thereon. Also the sizing of the capacitors 62, 64 is similar to that of the capacitors 52, 54 in order to bestow symmetry on the amplifier circuit.

With reference to FIG. 6, designated by the reference number 70 is a portion of a common mode amplifier circuit configured to generate the voltage signal $V_{CMFB}$ that biases, in use, the common mode feedback node 23 of the differential amplifier of FIG. 5.

The common mode amplifier circuit 70 comprises a differential input 71, which includes a first input transistor 72 and a second input transistor 74 (in particular, both MOSFETs of a P type), which have a respective source terminal coupled to the supply terminal 16. A current generator 75 is represented schematically arranged between the supply terminal 16 and the first and second input transistors 72, 74, and represent a current $I_{B2}$ absorbed by the differential input 71. The common mode amplifier circuit 70 further comprises other transistors (in particular, MOSFETs of an N type) 76, 78, coupled, respectively, between the first input transistor 72 and the reference terminal 20, and between the second input transistor 74 and the reference terminal 20. More in particular, the transistor 76 has a drain terminal connected to the drain terminal of the first input transistor 72 and a source terminal coupled to the reference terminal 20. The gate terminal is connected to the drain terminal, in diode configuration. Likewise, the transistor 78 has a drain terminal connected to the drain terminal of the second input transistor 74 and a source terminal coupled to the reference terminal 20. The gate terminal is connected to the drain terminal, in diode configuration.

The differential input 71 receives, as already illustrated in FIG. 1 for the common mode amplifier 4, the common mode voltage $V_{CM}$ of a fixed and pre-set value (e.g., equal to $V_{CC}/2$, and in any case chosen for having an optimal swing on the output) on the inverting input, and a signal that is a function of the output signal Vout on the non-inverting input. In particular, as illustrated in FIG. 6, the first input transistor 72 has its gate terminal coupled to an intermediate node 80 between the resistors 6 and 8 already illustrated in FIG. 1. The signal $V_{OUT\_N}$ present on the output terminal 1e has, ideally, the same value as the signal $V_{OUT\_N}$ present on the output terminal 1f and opposite sign. The function of the resistors 6 and 8 is consequently that of feeding back the half-sum of the signals $V_{OUT\_N}$ and $V_{OUT\_P}$. As a consequence of this, the voltage present on the node 80 is, ideally, the common mode voltage $V_{CM}$. In practice, however, deviations between the ideal values of $V_{OUT\_N}$ and $V_{OUT\_P}$ cause the node 80 not to present constantly a voltage $V_{CM}$, but to assume a value that is a function of this deviation.

The voltage $V_{CMFB}$ of the common mode feedback node 23 is picked up at the drain terminal of the first input transistor 72, which in this case coincides with the drain terminal of the transistor 76 and is a function of the signal, present on the node 80, that acts on the first input transistor 72.

The first and second capacitive elements 35, 45 have the function of introducing a pole and a zero in the Bode diagram of loop gain of the common mode amplifier circuit 70 ($G_{LOOP\_CMFB}$), prior to passage of $G_{LOOP\_CMFB}$ through the frequency axis. This condition is illustrated in FIG. 7, from which it may be noted that the curve $G_{LOOP\_CMFB}$ intercepts the frequency axis (unit-gain condition) at a frequency $f_0'$. A first pole of $G_{LOOP\_CMFB}$ is introduced at the frequency $f_1'<f_0'$, as has been described with reference to FIG. 2 (slope of the curve $G_{LOOP\_CMFB}$ of 20 dB/dec). Then, there may be noted the presence of a second pole $f_{P1}$ at the frequency $f_1'<f_{P1}'<f_0'$ (that sends the slope of the curve $G_{LOOP\_CMFB}$ to 40 dB/dec). Then, there may be noted the presence of a zero $f_{Z1}$ at the frequency $f_{P1}<f_{Z1}<f_0'$, which brings the slope of the curve $G_{LOOP\_CMFB}$ back to 20 dB/dec. The curve $G_{LOOP\_CMFB}$ does not present further poles or zeros before the frequency value $f_0'$, confirming the stability of the system in the configuration described previously.

The common mode amplifier is thus compensated in frequency with a negligible impact on operation of the differential amplifier 10. In fact, as may be noted from FIG. 5, the Bode diagram for the latter substantially reproduces the one according to the prior art.

The present applicant has further found that the amplifier circuit 10 according to the present disclosure is particularly effective for driving resistive loads coupled to the output terminals 1e, 1f.

With reference to FIG. 5, the capacitors 35 and 45, with capacitance $C_{CM}$, introduce a pole-zero for the common mode, whereas they have a negligible impact on the differential mode. The reason is explained in what follows. For the differential mode, since the circuit diagram is symmetrical with respect to the input stage 11, the signals present on the nodes of one half of the circuit diagram of FIG. 5 (e.g., the half symmetrically arranged on the left of the input stage 11) are the same in value as, and opposite in sign to, those present on the other half (e.g., the half symmetrically arranged on the right of the input stage 11); the node 23 common to the two capacitances $C_{CM}$ does not move. If this node 23 does not move, the capacitances $C_{CM}$ behave as if they were connected to ground, and thus constitute only an additional capacitive "burden" of the nodes 50 and 60. It may further be noted that already connected to the nodes 50 and 60 are the capacitors 52 and 62, which have respective capacitances that are comparable to or higher than $C_{CM}$. Also the gate capacitances of the MOS transistors 48 and 58 are comparable to or higher than $C_{CM}$. In this condition, there are not noted any major variations in operation, on the differential mode, due to the presence of the capacitance $C_{CM}$.

For the common mode, instead, since the signals present on corresponding nodes of the two circuit halves (which are symmetrical with respect to the input stage 11) are the same as one another, also the common node 23 of the capacitors 35, 45 moves, injecting a compensation current, via the capacitors 35, 45, into the (diode-connected) MOS transistor 76 of the circuit 70 of FIG. 6. Unlike the classic compensation, which defines the dominant pole and is obtained via the output capacitors 54 and 64, whose capacitances are in effect multiplied by the gain of the second stage 26, 36 and by the output gain 46, 56, as is known to the person skilled in the art, the compensation due to the presence of the capacitors 35, 45 has only a slight impact on the dominant pole since it is amplified only by the gain of the second stage 26, 36; however, it makes possible introduction of a pole at higher frequency and of a zero, as already discussed with reference to the Bode diagrams of FIG. 7.

Sizing of the first and second capacitive elements 35, 45 depends upon the transconductance values of the transistors 32, 42, 48, 58, 49, 59, upon the ratio between the transconductances of the transistors 22, 24 and the transconductance of the transistor 76, upon the compensation capacitances 52, 62, 54, 64, as well as upon the value of the load capacitance $C_L$ according to a formula that is obtained by solving Kirchhoff's equations of the equivalent small-signal model of the common mode amplifier circuit.

Figure 8:
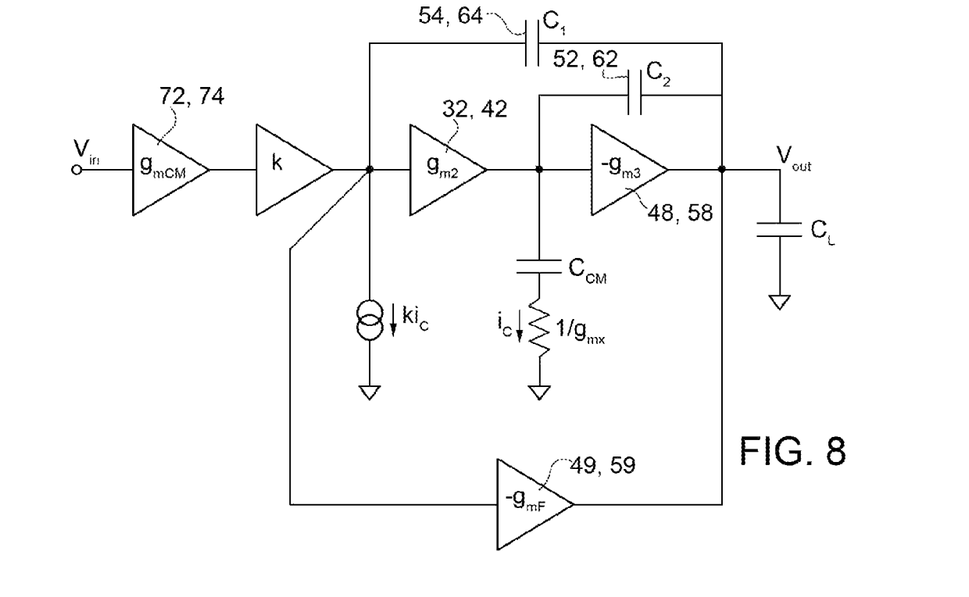
FIG. 8 shows an equivalent small-signal circuit of the common mode compensation circuit of FIG. 6.

By way of example, FIG. 8 shows the equivalent small-signal model of the circuit of a common mode amplifier, according to what is illustrated in FIGS. 5 and 6, where:

$g_{mCM}$ is the transconductance of the transistors 72 and 74;

k is the ratio between the transconductances of the transistors 22, 24 and the transconductance of the transistor 76;

$g_{m2}$ is the transconductance of the transistors 32, 42;

$g_{m3}$ is the transconductance of the transistors 48, 58;

$g_{mF}$ is the transconductance of the transistors 49, 59;

$g_{mX}$ is the tranconductance of the transistor 76;

$C_1$ is the capacitance of the capacitors 54, 64;

$C_2$ is the capacitance of the capacitors 52, 62;

$C_L$ is the load capacitance;

$C_{CM}$ is the capacitance of the capacitors 35, 45; and $i_C$ is the signal current that enters the transistor 76.

On the hypothesis that $g_{mX}/C_{CM}$ is much higher than $f_0'$, where $f_0'$ is the frequency at which the curve $G_{Loop\_CMFB}$ encounters the frequency axis (unit-gain condition—see FIG. 7), we have $$\frac{V_{out}}{V_{in}} \cong -\frac{kg_{mCM}}{sC_1} \cdot \frac{1+s\dfrac{C_{CM}+C_2}{g_{m2}}\cdot\dfrac{g_{mF}}{g_{m3}} - s^2\dfrac{C_{CM}+C_2}{g_{m2}}\cdot\dfrac{C_1}{g_{m3}}}{1+s\left[\dfrac{g_{mF}}{g_{m3}}\cdot\dfrac{C_{CM}+C_2}{g_{m2}}+\dfrac{C_2}{g_{m2}}+\dfrac{kC_{CM}}{C_1}\dfrac{C_L}{g_{m3}}\right]+s^2\dfrac{C_{CM}+C_2}{g_{m3}g_{m2}}\cdot\left(C_L+2C_2\dfrac{g_{mF}}{g_{m2}}\right)}$$

Sizing of the capacitances $C_{CM}$ thus depends upon the load $C_L$ and upon the aforementioned transconductance values. On the hypothesis that $C_L \gg C_1, C_2, C_{CM}$, we may write the following simplified equation:

$$\frac{V_{out}}{V_{in}} \cong -\frac{kg_{mCM}}{sC_1} \cdot \frac{\left(1+s\dfrac{C_{CM}+C_2}{g_{m2}}\cdot\dfrac{g_{mF}}{g_{m3}}\right)\cdot\left(1-s\dfrac{C_1}{g_{m3}}\right)}{\left(1+s\dfrac{kC_{CM}}{C_1}\dfrac{C_L}{g_{m3}}\right)\cdot\left(1+\dfrac{C_1}{kC_{CM}}\cdot\dfrac{C_{CM}+C_2}{g_{m2}}\right)}$$

where the ratio $$\frac{\left(1+s\dfrac{C_{CM}+C_2}{g_{m2}}\cdot\dfrac{g_{mF}}{g_{m3}}\right)}{\left(1+s\dfrac{kC_{CM}}{C_1}\dfrac{C_L}{g_{m3}}\right)}$$

defines the position of the pole and of the zero introduced into the Bode diagram of $G_{LOOP\_CMFB}$, already discussed with reference to FIG. 7.

The amplifier according to the present disclosure finds application in the field of general-purpose amplifiers, or else amplifiers operatively coupled to gyroscopes, accelerometers, and pressure sensors in MEMS technology, for example integrated in a readout block of a MEMS device 90.

Figure 9:
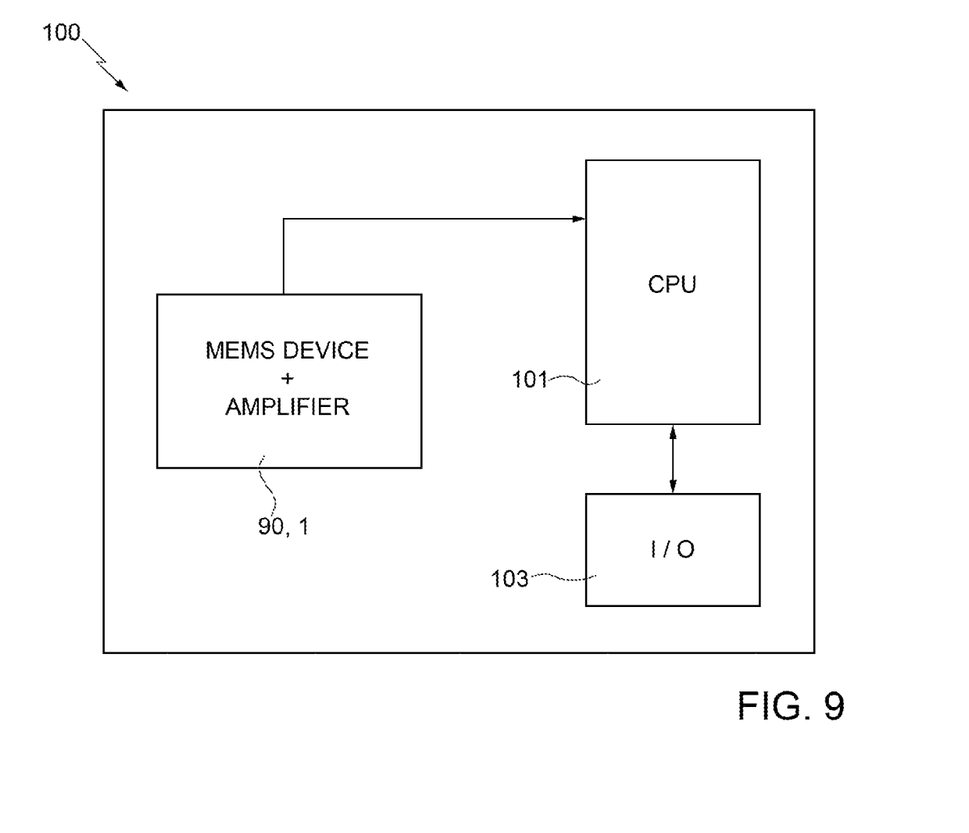
FIG. 9 shows an electronic device including the amplifier of FIGS. 5 and 6.

FIG. 9 shows an electronic device 100 including the differential amplifier 1, provided with the common mode feedback circuit according to the present disclosure, integrated in, or operatively coupled to, a MEMS device 90. The electronic device 100 is, for example, a mobile communication device, such as a cellphone, a PDA, a notebook, a player of audio files, etc. The electronic device 100 comprises a microprocessor 101 and an input/output interface 103, for example equipped with a keypad and a display, which is also connected to the microprocessor 101. The MEMS device 90 communicates with the microprocessor 101. Further signal-processing blocks (not illustrated) may be arranged between the MEMS device 90 and the microprocessor 101.

From an examination of the characteristics of the disclosure provided according to the present disclosure, the advantages that it affords emerge clearly.

In particular, the circuit solution proposed for introduction of a pole and a zero in the Bode diagram of the loop gain of the common mode amplification circuit may include just two additional capacitors (designated by the references 35 and 45) and does not require any type of active component or additional supply.

Furthermore, the common mode output error remains low in so far as the common mode feedback factor is not reduced, nor is the transconductance of the common mode input stage.

Furthermore, there is a negligible reduction of the dynamic range of amplification, and a negligible extra-consumption on the load.

Finally, the impact on the stability of the differential amplification circuit is minimal, and the stability of the latter is not jeopardized.

Finally, it is clear that modifications and variations may be made to the disclosure described and illustrated herein, without thereby departing from the scope of the disclosure.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multistage differential amplifier, comprising:
   first and second differential input terminals configured to receive a differential input voltage;
   first and second differential output terminals;
   a common mode detection circuit coupled to the first and second differential output terminals and configured to detect a common mode voltage and to generate a common mode feedback voltage for compensating the detected common mode voltage;
   an input stage including:
      a first differential input transistor coupled between a supply terminal and a first output node, and having a control terminal coupled to the first differential input terminal, the first differential input transistor being configured to supply a first differential driving signal to the first output node,
      a second differential input transistor coupled between the supply terminal and a second output node, and having a control terminal coupled to the second differential input terminal, the second differential input transistor being configured to supply a second differential driving signal to the second output node,
      a first active load coupled between the first output node and the reference terminal, and
      a second active load coupled between the second output node and the reference terminal, said first and second active loads having respective control terminals coupled to a common control node configured to receive the common mode feedback voltage;
   an output stage including:
      a first output branch including first and second output transistors, the second output transistor having a control terminal operatively coupled to the first output node, the first and second output transistors having respective conduction terminals coupled to one another and to the first differential output terminal, and
      a second output branch including third and fourth output transistors, the fourth output transistor having a control terminal operatively coupled to the second output node, the third and fourth output transistors having respective conduction terminals coupled to one another and to the second differential output terminal;
   a first capacitive element coupled between the control node and a control terminal of the first output transistor; and
   a second capacitive element coupled between the control node and a control terminal of the third output transistor.

2. The amplifier according to claim 1, wherein the common mode detection circuit comprises:
   first and second common mode input transistors;
   a first common mode feedback resistor coupled between the first differential output terminal and a control terminal of the first common mode input transistor; and
   a second common mode feedback resistor coupled between the second differential output terminal and the control terminal of the first common mode input transistor,
   wherein said second common mode input transistor has a respective control terminal configured to receive the common mode voltage,
   said common mode feedback signal being supplied between the first common mode input transistor and the reference terminal.

3. The amplifier according to claim 1, wherein the first capacitive element and the second capacitive element are capacitors having a value of capacitance between 3 pF and 20 pF.

4. The amplifier according to claim 1, further comprising:
   a gain stage including first and second gain inputs respectively coupled to the first and second output nodes, and first and second gain output terminals configured to supply respective first and second amplified differential signals.

5. The amplifier according to claim 4, wherein the gain stage comprises:
   a first gain branch including a first gain stage transistor having a control terminal coupled to said first gain input, and a second gain branch that forms, together with the first gain branch, a first current mirror configured to provide a first gain current on the second gain branch, said first gain output terminal being coupled to the second gain branch; and
   a third gain branch including a second gain stage transistor having a control terminal coupled to said second gain input, and a fourth gain branch that forms, together with the third gain branch, a second current mirror configured to provide a second gain current on the fourth gain branch, said second gain output terminal being coupled to the fourth gain branch.

6. The amplifier according to claim 5, wherein the first gain current and the second gain current have a substantially same value.

7. The amplifier according to claim 1, wherein the first and third transistors are PMOS transistors.

8. The amplifier according to claim 7, wherein the second and fourth transistors are NMOS transistors.

9. The amplifier according to claim 1, wherein the first output branch of the output stage further includes a first output capacitor coupled between the control terminal of the first output transistor and the first differential output terminal, and a second output capacitor coupled between the first output node and the first differential output terminal,     and wherein the second output branch of the output stage further includes a third output capacitor coupled between the control terminal of the third output transistor and the second differential output terminal, and a fourth output capacitor coupled between the second output node and the second differential output terminal.

10. An electronic device comprising:
at least one of a MEMS gyroscope, a MEMS accelerometer, and a MEMS pressure sensor; and
a readout circuit coupled to the at least one of a MEMS gyroscope, a MEMS accelerometer and a MEMS pressure sensor, the readout circuit including a multistage differential amplifier, including:
an input stage including:
first and second differential input transistors having respective control terminals configured to receive a differential input voltage, and
first and second load transistors having respective control terminals coupled to one another at a control node and configured to receive a common mode feedback voltage;
first and second differential output terminals;
a common mode detection circuit coupled to the first and second differential output terminals and configured to generate the common mode feedback voltage;
a gain stage coupled to the input stage and including first and second gain output nodes configured to supply first and second amplified differential signals, respectively;
a first capacitive element coupled between the control node and the first gain output node; and
a second capacitive element coupled between the control node and the second gain output node.

11. The electronic device according to claim 10, wherein the electronic device comprises at least one of: a cellphone, a PDA, a notebook, and an audio player.

12. A multistage differential amplifier, comprising:
an input stage including:
first and second differential input transistors having respective control terminals configured to receive a differential input voltage, and
first and second load transistors having respective control terminals coupled to one another at a control node and configured to receive a common mode feedback voltage;
first and second differential output terminals;
a common mode detection circuit coupled to the first and second differential output terminals and configured to generate the common mode feedback voltage;
a gain stage coupled to the input stage and including first and second gain output nodes configured to supply first and second amplified differential signals, respectively;
a first capacitive element coupled between the control node and the first gain output node; and
a second capacitive element coupled between the control node and the second gain output node.

13. The amplifier according to claim 12, wherein the common mode detection circuit comprises:
first and second common mode input transistors;
a first common mode feedback resistor coupled between the first differential output terminal and a control terminal of the first common mode input transistor; and
a second common mode feedback resistor coupled between the second differential output terminal and the control terminal of the first common mode input transistor,
wherein said second common mode input transistor has a respective control terminal configured to receive the common mode voltage, said common mode feedback signal being supplied between the first common mode input transistor and the reference terminal.

14. The amplifier according to claim 13, wherein the first capacitive element and the second capacitive element are capacitors having a value of capacitance between 3 pF and 20 pF.

15. The amplifier according to claim 13, further comprising an output stage including:
a first output stage transistor having a control terminal coupled to the first gain output node;
a second output stage transistor having a control terminal coupled to a conduction terminal of the first load transistor, the first and second output stage transistors having respective conduction terminals coupled to one another and to the first differential output terminal;
a third output stage transistor having a control terminal coupled to the second gain output node; and
a fourth output stage transistor having a control terminal coupled to a conduction terminal of the second load transistor, the third and fourth output stage transistors having respective conduction terminals coupled to one another and to the second differential output terminal.

16. A method of forming a multistage differential amplifier, comprising:
forming an input stage including first and second differential input transistors and first and second load transistors;
coupling a control terminal of the first differential input transistor to a first differential input terminal;
coupling a control terminal of the second differential input transistor to a second differential input terminal;
coupling a control terminal of the first load transistor to a control terminal of the second load transistor at a control node;
forming first and second differential output terminals;
forming a common mode detection circuit;
coupling the common mode detection circuit to the first and second differential output terminals;
forming a gain stage including first and second gain output nodes configured to supply first and second amplified differential signals, respectively;
coupling the gain stage to the input stage;
coupling a first capacitive element between the control node and the first gain output node; and
coupling a second capacitive element between the control node and the second gain output node.

17. The method according to claim 16, wherein forming the common mode detection circuit comprises:
forming first and second common mode input transistors;
coupling a first common mode feedback resistor between the first differential output terminal and a control terminal of the first common mode input transistor; and
coupling a second common mode feedback resistor between the second differential output terminal and the control terminal of the first common mode input transistor.

18. The method according to claim 16, further comprising:

forming first, second, third and fourth output stage transistors, each having a respective control terminal and a respective conduction terminal;
coupling the control terminal of the first output stage transistor to the first gain output node;
coupling the control terminal of the second output stage transistor to a conduction terminal of the first load transistor;
coupling the conduction terminals of the first and second output stage transistors to one another and to the first differential output terminal;
coupling the control terminal of the third output stage transistor to the second gain output node;
coupling the control terminal of the fourth output stage transistor to the conduction terminal of the second load transistor; and
coupling the conduction terminals of the third and fourth output stage transistors to one another and to the second differential output terminal.

* * * * *